Figure 1:
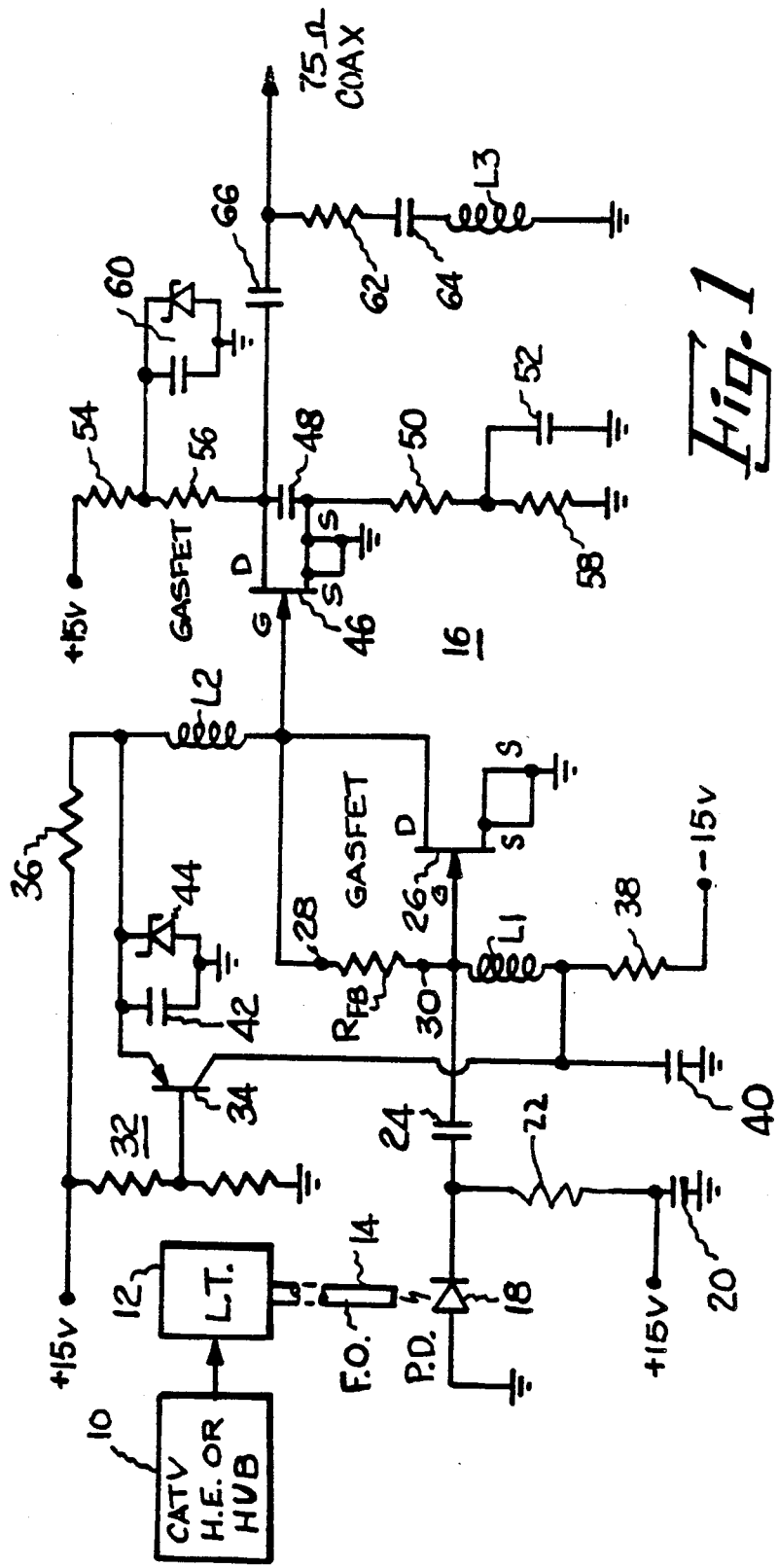

United States Patent [19]

Kruse

[11] Patent Number: 4,998,012

[45] Date of Patent: Mar. 5, 1991

[54] FIBER OPTIC TRANSIMPEDANCE RECEIVER

[75] Inventor: Herman A. Kruse, Winder, Ga.

[73] Assignee: Scientific Atlanta, Inc., Atlanta, Ga.

[21] Appl. No.: 445,299

[22] Filed: Dec. 1, 1989

[51] Int. Cl.⁵ ............................................. H01J 40/14
[52] U.S. Cl. ................................. 250/214 A; 455/619
[58] Field of Search ........................ 250/214 R, 214 A; 455/600, 619, 611; 307/311

[56] References Cited

U.S. PATENT DOCUMENTS

| | | | |
|---|---|---|---|
| 4,620,321 | 10/1986 | Chown | 250/214 A |
| 4,641,378 | 2/1987 | McConnell et al. | 455/619 |
| 4,750,217 | 6/1988 | Smith et al. | 250/214 A |
| 4,771,325 | 9/1988 | Cheng . | |
| 4,855,687 | 8/1989 | Hebert . | |
| 4,857,725 | 8/1989 | Goodnough . | |

*Primary Examiner*—David C. Nelms
*Assistant Examiner*—Que T. Le
*Attorney, Agent, or Firm*—Martin Lukacher

[57] ABSTRACT

A transimpedance receiver for broad band optical signals, such as carry multichannel CATV signals or broad band data over an optical fiber which may vary in length (e.g. from 2 km to 20 km) such that the optical power at a photodetector of the receiver may vary widely depending upon where the receiver, and is installed in the fiber optic distribution system utilizes a broad band device, preferably a GASFET, the internal capacitance and gain of which enables amplification over the broad band frequency range without oscillation. Different values of transimpedance for converting the current signal from the photodetector into an output voltage at the output (the drain) of the device which is in a range within which the device is linear, and does not introduce distortion into the signal, is obtained by connecting, between the output and the input of the device, a feedback resistor selected from a group consisting of resistors of different value each dependent upon the optical power of the optical signal applied to the photodetector. The output voltage is coupled to an electrical transmission line which may be a low impedance coaxial line using a buffer amplifier incorporating a device of the same type as used in the transimpedance amplifier which has connected thereto networks for controlling the spectral response of the receiver so that it remains essentially flat over the broad band frequency range.

9 Claims, 1 Drawing Sheet

FIBER OPTIC TRANSIMPEDANCE RECEIVER

The present invention relates to optical receivers, and more particularly to a fiber optic transimpedance receiver which is capable of converting optical signals of power which may vary over a wide magnitude range into output signal voltages having levels where the receiver operates linearly, without introducing significant distortion, and well above the level of noise over the frequency range of operation.

The invention is especially adapted for use in CATV distribution systems where the optical receiver may be located very close or very far from the CATV head end or hub, such that the signal which is transmitted by a laser transmitter may travel over an optical fiber the length of which may, for example, vary between 2 and 20 km. The invention may also be used in other broad band signal transmission systems using optical fibers (by which term is meant to encompass optical transmission links generally) such as broad band data transmission systems. Such data transmission systems include systems of the ISDN (integrated digital systems network) type.

Multichannel and therefore broad band (50 to 550 MHz) CATV signals are being transmitted over optical fiber distribution networks. Receivers at the end of the optical fibers translate the optical signals into corresponding electrical signals. It is vital that these receivers do not introduce distortion. It is also necessary that the receiver operate to provide output signals of level significantly above the noise level in the system. Conventional receivers have not been capable of maintaining the distortion and noise performance over the broad band width occupied by the CATV signals in a distribution system where optical power at the receiver can vary over a wide range, being extremely high and close to the 2 mW level of conventional laser transmitters at the end of short optical fibers and highly attenuated at the end of long optical fiber lines. A photodetector is used to translate the optical power into an electrical signal and functions as a current source providing a composite video current signal modulated by the multichannel CATV signals. When the fiber optic lines are short and the power is high, this signal current overdrives the amplifiers in the receiver causing distortion which cannot be tolerated because of the effect thereof on picture quality. Where not enough signal current is available, the picture quality is limited by noise. Transimpedance amplifiers are often used in optical receivers to provide an output voltage signal corresponding to the current signal which then drives electrical transmission lines which distribute the CATV signals to subscribers.

It has been found that the use of active devices for controlling input current levels and amplifier gain have been inadequate in that they are not sufficiently linear over the dynamic range and broad band width of multichannel video signals such as CATV signals. Such active devices often times have internal capacitances of such value as to cause amplifiers to oscillate within the band width of the signals thereby effectively limiting the range over which they are effective in controlling the gain of the signals.

It is the principal object of the present invention to provide an improved optical receiver which is responsive to broad band optical signals which can vary in optical power and contains a transimpedance amplifier having distortion and noise performance meeting the requirements of television applications, even where the optical power of the signals which are received can vary over a large magnitude range as, for example, when delivered by very short or by very long optical fiber transmission lines.

It is a further object of the present invention to provide an improved fiber optic transimpedance receiver having a transimpedance amplifier in which the current to voltage conversion gain may be changed to minimize distortion and noise in output signals produced by the receiver so as to accommodate input signals of different power level.

It is a still further object of the present invention to provide an improved fiber optic transimpedance receiver having distortion and noise performance which meets the requirements for CATV applications.

Briefly described, an optical receiver in accordance with the invention is responsive to broad band optical signals (by broad band is meant a band width at least commensurate with the CATV band, 50–550 MHz) transmitted over a transmission path such as defined by an optical fiber. The receiver has a photodetector terminating the path and provides an output electrical current corresponding to the optical power of the optical signals. The optical power varies in magnitude depending upon the length of the transmission path. A broad band, low capacitance amplifier including a device having internal capacitance and transconductance (gm) sufficient to provide gain without oscillations over the broad band is used. Preferably, the device is a galium arsenide field effect transistor (GASFET) having a gate, a source, and a drain. The receiver includes means for providing transimpedance operation of the amplifier over the broad band to produce an output voltage corresponding to the optical signals. The amplifier has means for connecting between its output and input (between the gate and one of the source and drain of the GASFET) a feedback resistor selected from a group consisting of resistors of different value, each dependent upon the optical power of the optical signal which the photodetector translates into the output electrical current. The amplifier has constant voltage gain. The current to voltage conversion gain ($V_O/I_{in}$), which is proportional to the transimpedance $Z_T$ is changed dependent upon the optical signal power. Since the optical power at the end of the various optical fibers in the distribution system is known and is data available to the installers and technicians who work on the system, they may readily select and install a feedback resistor of requisite value. Then, the receiver will provide an output voltage into the electrical transmission line which feeds the subscribers television sets which remains, on average, essentially constant (of course being modulated by the amplitude modulated composite video) and is in the linear range where distortion is minimized but signal levels are well above system noise levels.

Figure 2:
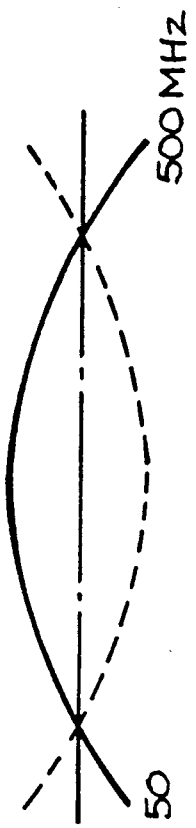

The foregoing and other objects, features and advantages of the invention as well as a presently preferred embodiment thereof will become more apparent from a reading of the following description in connection with the accompanying drawings in which:

FIG. 1 is a schematic diagram of a fiber optic transimpedance receiver embodying the invention; and FIG. 2 are curves showing the spectral response of the transimpedance amplifier stage (the solid line curve), the buffer amplifier stage (the dashed line curve), and the receiver output (the essentially straight line curve made up of long and short dashes).

Referring to the drawings, there is shown a CATV head end or hub 10 which provides a multichannel CATV signal to a laser transmitter (L.T.) 12. An illustrative optical fiber transmission line (F.O.) 14 delivers the CATV signals to a location in the distribution system. This location may vary widely in distance from the laser transmitter 12 at the head end or hub 10. The fiber optic may, for example, be 2 km long or 20 km long or any distance therebetween. The system map will identify the optical power at the terminating end of the fiber optic 14. For example, if the fiber optic 14 is short, the optical power may be of the same order as the laser power which is produced at the laser transmitter 12 (e.g., 2 mW).

A transimpedance receiver 16 is located at the termination of the fiber optic 14. The input to the receiver is provided by a photodiode photodetector 18 optically coupled to the terminating end of the fiber optic 14. This diode is biased by current from a source indicated as at +15 volts through a resistor 22. An RF bypass capacitor 20 prevents RF from entering the power supply source (15V). The resistor 22 is of much higher resistance than the impedance to RF presented by a coupling capacitor 24. Accordingly, the current signal from the photodiode 18 is applied to the input of a GASFET device 26. This device has gate (G) drain (D) and dual source (S and S) electrodes. The device may be an NE72084.

The GASFET is especially suitable for use in the receiver 16 since it has low internal capacitance and reasonable gain (7 or 8) over the CATV band. A pair of terminals 28 and 30 is connected to the drain and gate. It will be appreciated that the device may be operated as drain grounded instead of source grounded by reversing the power supply potential and making output and load connections to the source. The source grounded configuration is shown since it is presently preferred.

The terminals 28 and 30 are connected to the drain and gate respectively. They provide the connections of the RF feedback resistor. This feedback configuration provides transimpedance amplifier operation of the GASFET. The value of the resistor $R_{FB}$ is selected in accordance with the transimpedance $Z_T$ required for distortion and noise performance to maintain constant RF level (average level on which the composite video is modulated) over the broad band. $R_{FB}$ is changed by plugging on resistors of different values of resistance, selected in accordance with the optical power at the terminating end of the fiber 14. Suitable values for $R_{FB}$ for different optical powers and the resultant transimpedance is set forth in the following table.

| Optical Power (mW) | Transimpedance $Z_t$ | Feedback $R_{FB}$ (ohms) |
| --- | --- | --- |
| 1.5 | 230 | 300 |
| 1 | 350 | 430 |
| .5 | 700 | 820 |
| .25 | 875 | 1,000 |

The GASFET amplifier has applied thereto DC bias by a bias regulating circuit 32. In this circuit 32, a voltage divider sets a reference level at the base of a transistor 34. The emitter senses the voltage at the drain, across resistor 36 suitably of 270 ohms. The connection to the drain is through an RF inductor L2 which is desirably wound on a ferrite bead. The emitter of the transistor 34 is connected to the gate through another inductor L1. The transistor 34 maintains the bias voltage applied to the gate (across a 900 ohm resistor 38 which is bypassed by a capacitor 40). The inductor L1 compensates for the internal capacitance in the photodiode and the input capacitance of the GASFET 26. This peaks the response so as to produce the response shown in the solid line curve of FIG. 2.

A protective circuit consisting of a zener diode 44 is connected to the drain of the GASFET via the choke L2 and protects the GASFET against transients which may occur when the receiver is turned on and off as by connecting and disconnecting the power supply which provides the voltages indicated as +15V.

In order to prevent the output transmission line (a low impedance 75 ohm coax) from loading the circuit and reducing the gain of the transimpedance GASFET amplifier 26, a buffer amplifier having a second GASFET 46 which may be the same type as the GASFET 26, is connected to the output of the transimpedance amplifier (to the drain of the GASFET 26). A small capacitor 48 (e.g. 1.5 pf) is connected between drain and source of the GASFET 46 and provides the means by which the gain of the stage is reduced above the frequency band of interest. These GASFETS have significant gain to 100 GHZ and have the potential of going unstable if such precautions are not taken. A feedback resistor 50 is connected to ground via an RF bypass capacitor 52 to control the gain of the buffer amplifier. The DC path from drain to source is through load resistors 54 and 56 from +15V to drain and through the feedback resistor 50 and a DC bias level setting resistor 58. A protective circuit 60, similar to the circuit containing the capacitor 42 and zener 44, is connected to the GASFET 46 drain via the load resistor 56. The capacitor 48 is desirably connected closely adjacent to the GASFET 46 with minimal separation between the ends of the capacitor 46 and the drain and source.

An RLC trimming circuit (not shown) may be connected between source and ground in the buffer amplifier for spectral response trimming. The spectral response is made generally flat, as shown by the line made up of long and short dashes in FIG. 2, by an RLC circuit consisting of a resistor 62, a capacitor 64, and an RF choke L3. This network provides the compensating response indicated by the short dash line in FIG. 2, so that the resulting response is generally flat. The output of the GASFET buffer is connected to the network and to the output transmission line via coupling capacitor 66.

From the foregoing description, it will be apparent that there has been provided an improved optical receiver which is adapted for use as a fiber optic receiver in CATV distribution systems. Variations and modifications of the herein described receiver within the scope of the invention, will undoubtedly suggest themselves to those skilled in the art. Accordingly, the foregoing description should be taken as illustrative and not in a limiting sense.

What is claimed is:

1. An optical receiver responsive to broad band optical signals over a band at least commensurate with the CATV band (50-550 MHz) which signals are transmitted over a transmission path such as defined by an optical fiber, said receiver comprising a photodetector terminating said path which provides an output electrical current corresponding to the optical power of said optical signals which varies in magnitude depending upon the length of said path, a broad band low capacitance amplifier including a device having a capacitance and transconductance sufficient to provide gain without oscillations over said broad band, means for providing transimpedance operation of said amplifier over said broad band to produce output signals corresponding to said optical signals which comprises means for connecting from the output to the input of said amplifier a feedback resistor selected from the group consisting of resistors of different value each dependent upon the optical power of said optical signal.

2. The receiver in accordance with claim 1 wherein said amplifier includes a GASFET having a gate, a source and a drain, said feedback resistor being connected between said gate and one of said source and drain.

3. The receiver in accordance with claim 2 further comprising means for connecting an output transmission line to the output of said amplifier for receiving said output voltage, a buffer amplifier stage having a high impedance input connected to said one of said source and drain and that output impedance essentially matched to said transmission line's impedance.

4. The receiver in accordance with claim 3 wherein said buffer amplifier comprises a second GASFET having a gate, a source and a drain, said gate being connected to said one of said source and drain of said first named GASFET, a network having a spectral response over said broad band which generally compensates for the variations from constancy over said broad band of the spectral response due to said first named GASFET and the circuitry connected thereto, said network being connected to one of said source and drain of said second GASFET.

5. The receiver in accordance with claim 4 further comprising a capacitor connected from said drain to said source of said second GASFET for bypassing frequency components of said output voltage which are higher the upper end of said broad band.

6. The receiver in accordance with claim 2 wherein said transmission path is provided by an optical fiber between a head end or a hub of a CATV distribution system where said optical signals on said fiber originate, said photodetector being located at the output end of said optical fiber where said fiber terminates, said end being adjacent to said photodetector, said optical power varying in accordance with said length and said feedback resistor having the value which is related to said optical power at said fiber end to present transimpedance values, $Z_T$, to said photodetector in accordance with the following table:

| Optical Power (mW) | Transimpedance $Z_t$ | $R_{FB}$ (ohms) |
|---|---|---|
| 1.5 | 230 | 300 |
| 1 | 350 | 430 |
| .5 | 700 | 820 |
| .25 | 875 | 1,000 |

7. The optical receiver in accordance with claim 2 further comprising means connected between said one of said drain and source and said gate for applying regulated DC bias to said gate.

8. The method of converting an optical signal, which is transmitted from a head end of a CATV distribution system over an optical fiber transmission line and is tapped from said line, into an electrical signal the voltage amplitude of which corresponds to the power of the optical signal, which method comprises the steps of converting said optical signal into an electrical signal current corresponding thereto, converting said signal current into said electrical signal voltage using a transimpedance amplifier, selecting a resistor from the group consisting of resistors of different value each dependent upon the length of said line between said head end and where such optical signal is tapped, and connecting said resistor in feedback relationship in said amplifier.

9. The method according to claim 8 wherein said selecting step is carried out by selecting said resistors of said values which are set forth in the following table for optical signals of optical power set forth in said table, said amplifier having transimpedance values set forth in said table,

| Optical Power (MW) | Transimpedance (OHMS) | Resistor Value (OHMS) |
|---|---|---|
| 1.5 | 230 | 300 |
| 1.0 | 350 | 430 |
| 0.5 | 700 | 820 |
| 0.25 | 875 | 1,000 |

* * * * *